(12) United States Patent
Gage et al.

(10) Patent No.: US 6,188,253 B1
(45) Date of Patent: Feb. 13, 2001

(54) ANALOG CLOCK MODULE

(76) Inventors: Robert Bruce Gage, 13475 SW. Tapadera St., Beaverton, OR (US) 97008; Benjamin Brown, 1159 Tyndall Ct., Lake Oswego, OR (US) 97034

( * ) Notice: Under 35 U.S.C. 154(b), the term of this patent shall be extended for 0 days.

(21) Appl. No.: 09/167,883

(22) Filed: Oct. 7, 1998

(51) Int. Cl.[7] .................................................. H03L 7/16
(52) U.S. Cl. ............................................ 327/105; 327/147
(58) Field of Search ................................. 327/141, 105, 327/163, 147, 153, 154, 106

(56) References Cited

U.S. PATENT DOCUMENTS

| | | | |
|---|---|---|---|
| 5,179,359 | * 1/1993 | Mcleod | 331/38 |
| 5,289,116 | 2/1994 | Kurita et al. | 324/158 R |
| 5,481,471 | 1/1996 | Naglestad et al. | 364/489 |
| 5,654,657 | 8/1997 | Pearce | 327/163 |
| 5,710,517 | 1/1998 | Meyer | 327/163 |
| 5,757,239 | * 5/1998 | Gilmore | 331/18 |
| 5,864,492 | * 1/1999 | Sadot | 364/718.01 |

OTHER PUBLICATIONS

Gage, Robert et al.: "The Cat—Exact Data Transfer To DDS–Generated Clock Domains In A Single–Chip Modular Solution". International Test Conference, US, New York, NY. Vol. Conf. 29, 1998, pp. 507–513, XP000822391 ISBN: 0–7803–5093–6.

* cited by examiner

*Primary Examiner*—Tuan T. Lam
(74) *Attorney, Agent, or Firm*—Lance M. Kreisman (57) ABSTRACT

An analog clock apparatus is disclosed including a digital clock source for producing a digital waveform of a predetermined frequency and a direct-digital-synthesizer. The synthesizer has an input to receive the digital waveform and is operative to generate a resultant analog waveform. Prediction logic is coupled to the digital clock source and the synthesizer for determining the relative phase relationships between the digital waveform and the analog waveform. The prediction logic is responsive to a prediction clock having a clock frequency approximating that of said digital clock source.

14 Claims, 10 Drawing Sheets

ANALOG CLOCK MODULE

FIELD OF THE INVENTION

The invention relates generally to automatic test equipment for testing mixed-signal integrated circuits, and more particularly an analog clock module for generating a predictable analog waveform from a digital clock source.

BACKGROUND OF THE INVENTION

Mixed signal integrated circuits provide analog and digital signal processing capabilities on single chip structures. The capability of miniaturizing digital and analog devices on a single mixed-signal IC has made a considerable economic impact in the video and radio frequency (RF) communications markets.

Like conventional digital IC's, mixed-signal IC's typically undergo extensive tests to verify acceptable operation. Generally, the tests are carried out on each device under test (DUT) by an automatic test system commonly referred to as a "tester". The tester generally checks out each DUT by applying digital patterns or vectors to selected DUT pins to simulate actual or expected operating conditions under a variety of scenarios. The outputs generated by the IC, in response to the test input signals, are captured by the tester and compared against expected outputs to determine whether any faults exist.

For digital IC's, the vectors are typically programmed and executed entirely in the digital domain. In contrast, mixed-signal devices require test inputs from not only digital patterns, but also analog waveforms. In order to conduct repetitive and deterministic testing procedures, the digital signals, analog signals and commands or opcode patterns must be applied to the mixed signal device in a predictable manner. Generally, this involves implementing an analog signal generator or clock having a deterministic phase relationship to the digital clock.

An important reason for requiring the predictable phase relationship between the analog and digital clock involves opcode or instruction passing between the digital and analog domains. Typically, the digital and analog waveforms and the associated instruction sets originate from software resident in the digital domain. In order for analog instruments to process commands at the correct timing with respect to the digital clock, the instruction must be "tossed" from the digital to the analog domain appropriately. Thus, the combination of digital timing, analog timing, and respective phases between waveforms must be consistent and predictable from test-to-test.

One proposal for a mixed-signal tester, such as the Catalyst model available from Teradyne Inc., the assignee of the present invention, generates an analog clock through direct-digital-synthesis (DDS) of a high-speed digital clock. DDS techniques for generating analog clocks are well known in the art and generally involve driving a counter with a digital clock, such that the counter incrementally advances a summed value with each subsequent clock period. The count value is referenced to a look-up table or memory for a digital representation of an analog sine wave. The digital representation is then fed through a digital-to-analog converter (DAC) to produce the analog signal. Further conditioning of the analog signal often occurs to form the desired analog clock To predict the relative phases between the digital master clock and the DDS-generated analog clock, the tester described above drives the DDS module with a 500 MHz digital signal that, in turn, is referenced to a 100 MHz master oscillator. The 500 MHz clock provides five potential rising-edges for generating an analog clock edge within the reference 100 MHz clock period. A processor evaluates the edges to determine which digital edge lies coincident with the analog edge. This information is then fed to an opcode passing mechanism to avoid "tossing" microcode during the 100 MHz period of the digital master oscillator that includes the analog edge.

While this system works well for its intended applications, the implementation of a 500 MHz clock to provide finer resolution in the edge prediction technique presents some problems. First, generating a 500 MHz waveform often uses a combination of lower-speed modules multiplexed and interleaved to create a higher frequency signal. Not only is this often fairly costly in terms of hardware, but the time expended in controlling and maintaining the calibration of such a high-frequency device creates additional costs. In addition, as the speed of operation is increased, creating a 5× clock becomes a technical problem which itself limits the range of application of the invention.

What is needed and heretofore unavailable is an analog clock module that provides a cost-effective approach to generate an analog clock from a digital clock and predict the relative phase relationships between the respective clocks. Moreover, the need exists for an analog clock that maintains a relatively stable calibration, and automatically calibrates. Additionally, the need exists for such an analog clock having independent adjustable controls to manipulate the analog clock with respect to the digital clock. The analog clock module of the present invention satisfies these needs.

SUMMARY OF THE INVENTION

The analog clock module of the present invention provides a convenient way to generate a relatively cost-effective and stable analog clock from a digital clock, and to predict the relative phase relationship between the two clocks. This is done in a manner that requires fewer calibrations of the analog clock, and enables automatic calibration during operation. Moreover, the invention is conveniently implemented in a single integrated circuit structure to minimize hardware costs and improve mixed-signal device performance.

To realize the foregoing advantages, the invention in one form comprises an analog clock apparatus including a digital clock source for producing a digital waveform of a predetermined frequency and a direct-digital-synthesizer. The synthesizer has an input to receive the digital waveform and is operative to generate a resultant analog waveform. Prediction logic is coupled to the digital clock source and the synthesizer for determining the relative phase relationships between the digital waveform and the analog waveform. The prediction logic is responsive to a prediction clock having a clock frequency approximating that of said digital clock source.

In another form, the invention comprises an analog clock apparatus including a digital clock source for producing a digital waveform of a predetermined frequency and a direct-digital-synthesizer having a clock input to receive the digital waveform. The synthesizer is operative to generate an analog waveform and further includes a plurality of independently adjustable waveform parameter inputs.

In yet another form, the invention comprises an analog clock apparatus including a digital clock source for producing a digital waveform of a predetermined frequency and a direct-digital-synthesizer having an input to receive the digital waveform. The synthesizer is operative to generate an analog waveform. Opcode passing circuitry is included for synchronizing the deterministic handoff of opcode from the digital domain to the analog domain.

A further form of the invention comprises an analog control extension apparatus for interfacing analog instruments to a mixed-signal automatic tester. The analog control extension apparatus includes a mainframe distribution module having respective inputs and outputs to and from the tester, and a control vector module coupled to the mainframe distribution module. An analog clock apparatus is responsive to the control vector module for generating a resultant analog clock signal. The analog clock apparatus includes a digital clock source for producing a digital waveform of a predetermined frequency and a direct-digital-synthesizer. The synthesizer has an input to receive the digital waveform and is operative to generate the resultant analog waveform. Prediction logic is coupled to the digital clock source and the synthesizer for determining the relative phase relationships between the digital waveform and the analog waveform. The prediction logic is responsive to a prediction clock having a clock frequency approximating that of said digital clock source.

Other features and advantages of the present invention will be apparent from the following detailed description when read in conjunction with the accompanying drawings.

DETAILED DESCRIPTION OF THE INVENTION

Figure 1:
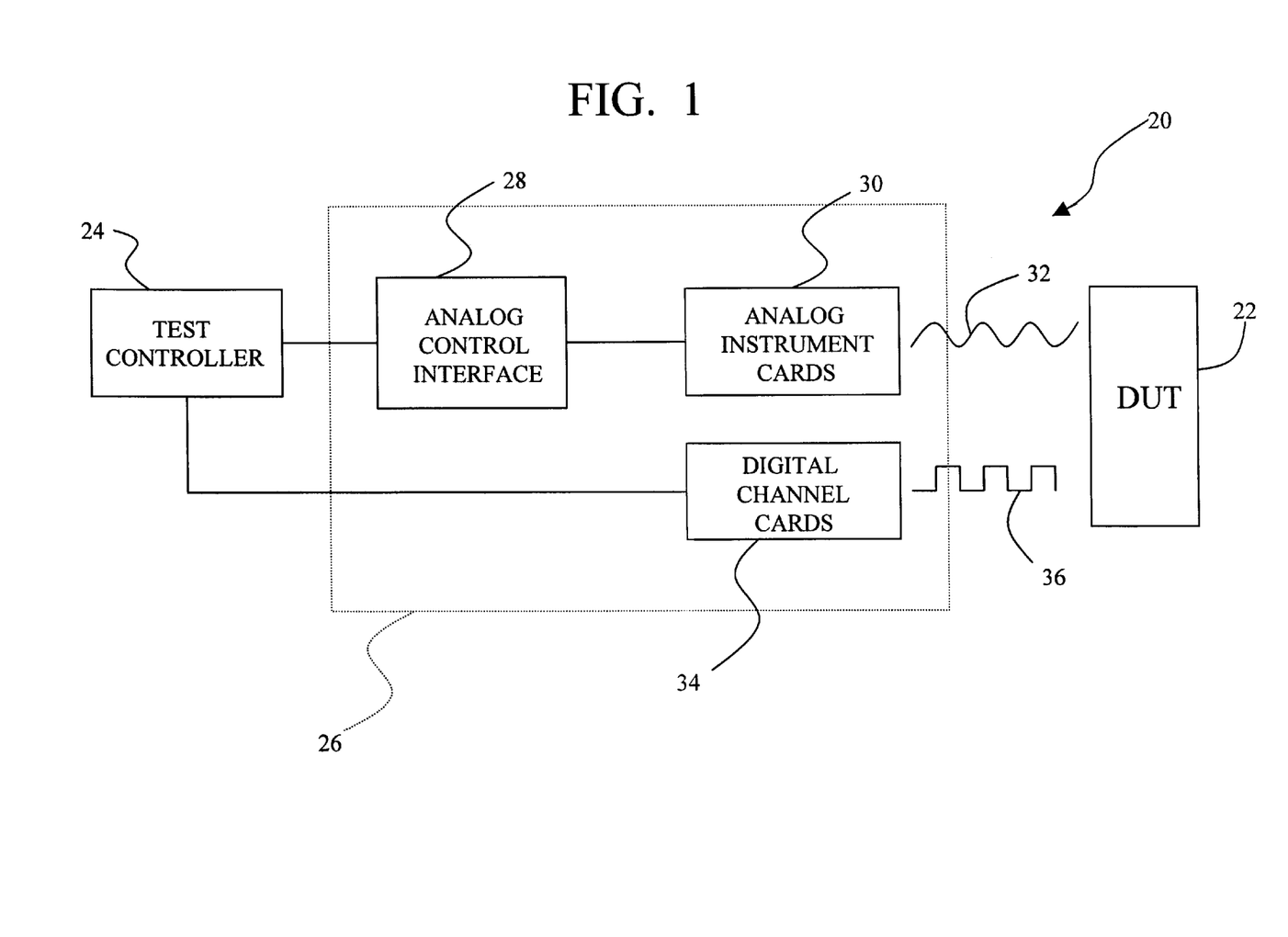
FIG. 1 is a block diagram of a mixed signal tester according to one embodiment of the present invention.

Referring now to FIG. 1, a mixed signal tester according to one embodiment of the present invention, generally designated 20, generates and receives analog and digital test signals to and from a DUT 22 for fault determination. The tester includes a digital mainframe test controller 24, such as a computer, for controlling the application and processing of test signals to and from the DUT. Pin electronics 26 are responsive to the test controller and generate the necessary digital and analog test signals for application to the DUT.

The pin electronics include an analog control interface 28 that couples a plurality of analog instrument cards 30 to the controller and generates analog waveforms 32. A plurality of digital channel cards 34 generates digital patterns 36 for application to the DUT in a deterministic manner with respect to the analog test signals. The DUT performance and fault criteria may then be analyzed with respect to the variety of input and output signals.

Figure 2:
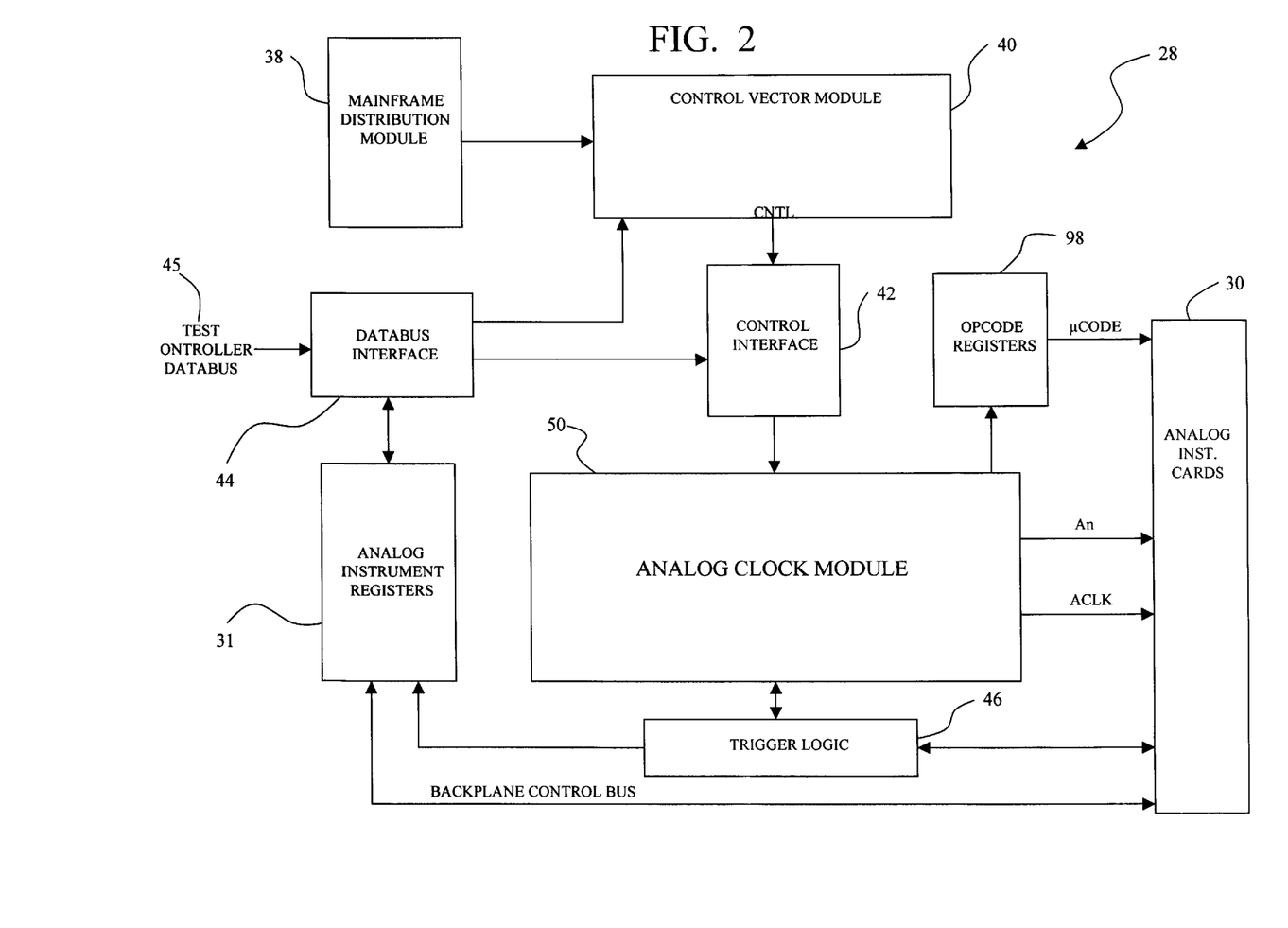
FIG. 2 is a block diagram of the analog control interface shown in FIG. 1.

Referring more particularly to FIG. 2, in order to attain the deterministic and repeatable characteristics between the analog and digital waveforms, the analog control interface 28 employs a mainframe distribution module 38 that distributes a plurality of control signals to the inputs of a control vector module 40. A control interface 42 collects control signals CNTL from the control vector module and digital residue signals RES from the distribution module, and sequentially feeds the residue signals to an analog clock module, generally designated 50. A databus interface 44 establishes a plurality of data paths between the test controller databus 45 and the control vector module, control interface, and the analog instrument cards. Trigger logic 46 sets and drives trigger signals for the analog instrument registers, the analog clock module, and the analog instrument cards.

Figure 3:
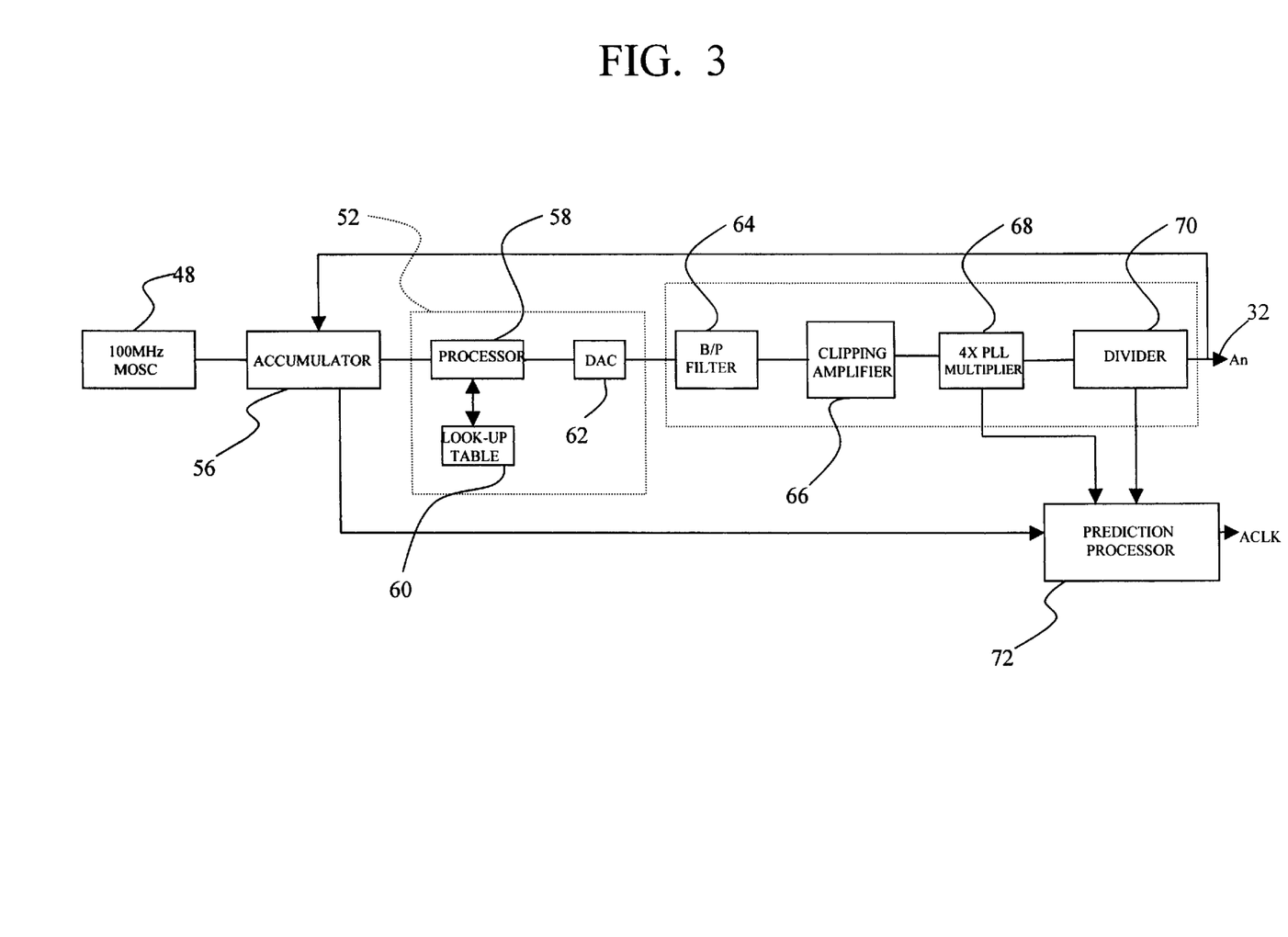
FIG. 3 is a block diagram of the analog clock module shown in FIG. 2.

With particular reference to FIG. 3, the analog clock module 50 according to one embodiment, includes a direct-digital-synthesizer (DDS) 52 to generate an analog waveform from a digital clock source 48. Prediction logic 72 enables an accurate prediction of the phase relationship between the digital and analog clocks in a straightforward and cost-effective manner.

Further referring to FIG. 3, the DDS 52 employs a 100 MHz digital clock 48 as the digital input source to a forty-eight-bit accumulator 56. The accumulator continually adds an incremental value with each 100 MHz period received from the digital input source. A DSS processor 58 receives an incrementally summed forty-eight-bit numerical phase output from the accumulator and matches the output to a quarter-wave sine function look-up table 60. The look-up value is then fed to a twelve-bit high-speed digital-to-analog converter (DAC) 62 which outputs stepped signals of frequencies within the range of about 16 MHz to 25 MHz along an analog sine waveform.

With continued reference to FIG. 3, in order to refine the analog output signal from the DAC 62, a signal conditioner 63 comprising several signal conditioning components is employed at the output of the DAC. The signal conditioner includes a bandpass filter 64 comprising a 7-pole elliptical filter disposed at the DAC output. The inventors have determined that the output frequency should be limited to one-fourth the clock frequency in order to eliminate the ¼ and ⅓ clock harmonics from the output. Moreover, the output of the filter should have a sharp cutoff at 25 MHz.

The filtered analog output feeds a clipping amplifier 66 to increase the edge rate of the clock to an acceptable speed. Additionally, the amplifier converts the analog signal level to an emitter-coupled-logic (ECL) clock level for input to a phase-locked-loop (PLL) multiplier 68.

The phase-locked-loop (PLL) multiplier 68 plays an important role in the present invention and couples to the output of the clipping amplifier 66 to multiply the analog signal frequency to a level within the range of about 64 MHz to 100 MHz. As will be described below, this creates additional edges from which to predict the position of the created analog clock edge with respect to the digital source edge. The PLL output defines an analog master clock (AMC)

and drives a divider 70 which reduces the PLL multiplied frequency to a desired level and establishes the programmed analog clock output 32.

An important aspect of the present invention is the capability of predicting the relative phases of the analog clock 32 and the 100 MHz digital clock source 48 in a cost-effective and accurate manner. Once predicted, the deterministic relationship enables an evaluation of whether a particular 100 MHz clock period coincides with the rising-edge of an analog clock period. This is important with respect to properly passing opcode from the digital to analog domain to control the analog instruments.

Further referring to FIG. 3, to realize the prediction feature of the present invention, one output of the divider 70 is fed to the prediction logic 72 that also receives respective outputs from the accumulator 56 and the PLL 68. The accumulator value is combined with the state of the output divider by the prediction processor to produce an event signal indicator ACLK.

Figure 4:
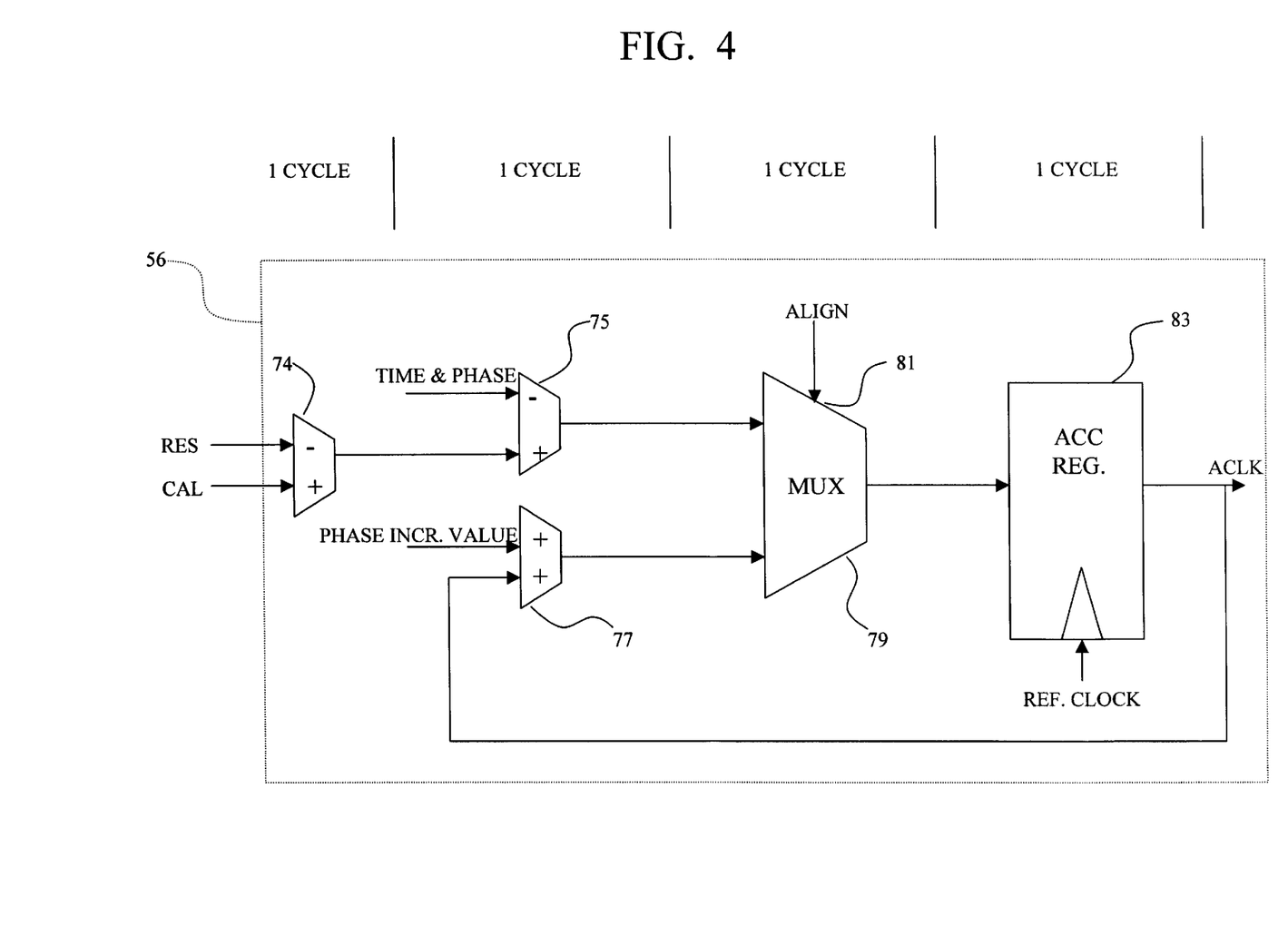
FIG. 4 is a functional block diagram illustrating the prediction logic and sequencing employed in the analog clock module of FIG. 3.

To more fully understand the prediction logic 72 and associated processing, FIG. 4 illustrates a block diagram segmented according to cycle shifts from the multiplied PLL signal. The logic generally includes a plurality of adders 74, 75 and 77 that are implemented in the accumulator 56. The adders provide convenient inputs to allow independent adjustable control of the time and phase adjustment at 67, the residue and calibration values, at 69 and 71, and the incremental phase value at 73. The summed inputs are fed to a multiplexer 79 driven by an alignment command at 81, that outputs a multiplexed value to an accumulator register 83. The output of the accumulator register is fed back to provide a summed input in combination with the incremental phase value at the adder 77.

In order to make the handoff from the digital clock source logic to the analog clock domain, the prediction logic 72 identifies when the data may be updated by defining a window in which there is a guarantee of no coincident analog edge. This is simply the window when ACLK is not true.

Since the parameters of the "window" must be defined accurately, calibration hardware 80 (FIG. 5A) is required to generate the calibration signal CAL to more accurately align the analog clock edge with the digital clock edge. For the opcode handoff to the analog instruments, this calibration is in terms of the edges at the point of handoff, and applied at the inputs of the accumulator adder 74.

Figure 5A:
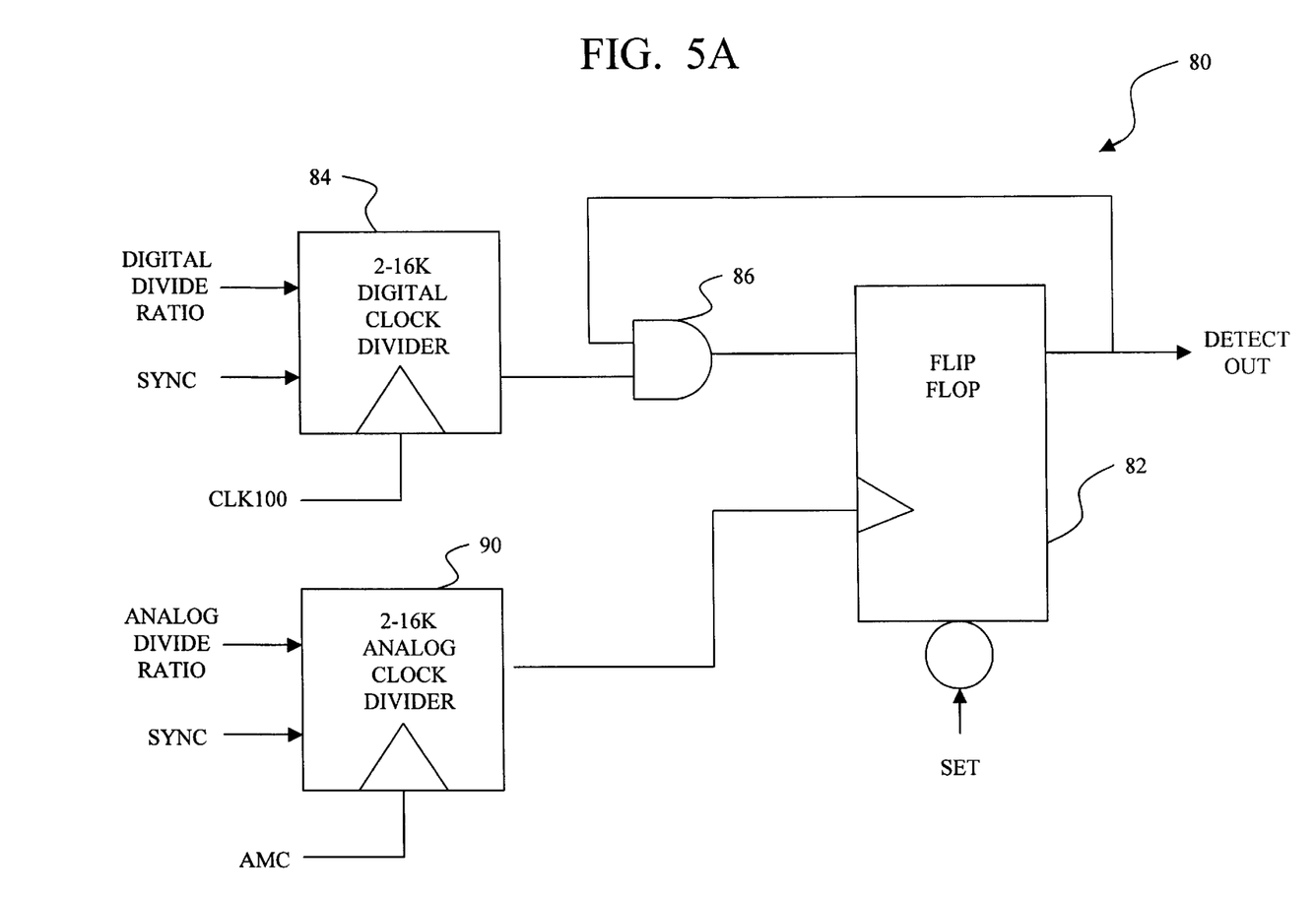
FIG. 5A is a block diagram of the calibration logic associated with the analog clock of FIG. 3.

Referring now to FIG. 5A, the clock calibration hardware 80 comprises a meta-state hard flip-flop register 82 that is resettable at SET from a databus (not shown). The register employs a digital clock source CLK100 divided by a 2–16K digital clock divider 84. The output of the divider is ANDed with a sampled detection signal DETECT OUT by an AND gate 86. The data for the register comprises an analog clock output 88 divided by a 2–16K analog clock divider 90. The logic surrounding the register 82 is such that it latches low once it has clocked in a low input. The analog frequency, analog divide ratio, and digital divide ratio are chosen so that the output of the analog divider and digital divider are identical in frequency.

When a user programs an analog clock frequency, there are two components of the analog clock frequency that must be placed in registers: the divide ratio and the analog master clock AMC (undivided PLL output) ladder. Additionally, the appropriate AMC frequency dependent calibration values for offset and range checking must be placed in a look-up CAL table.

Figure 5B:
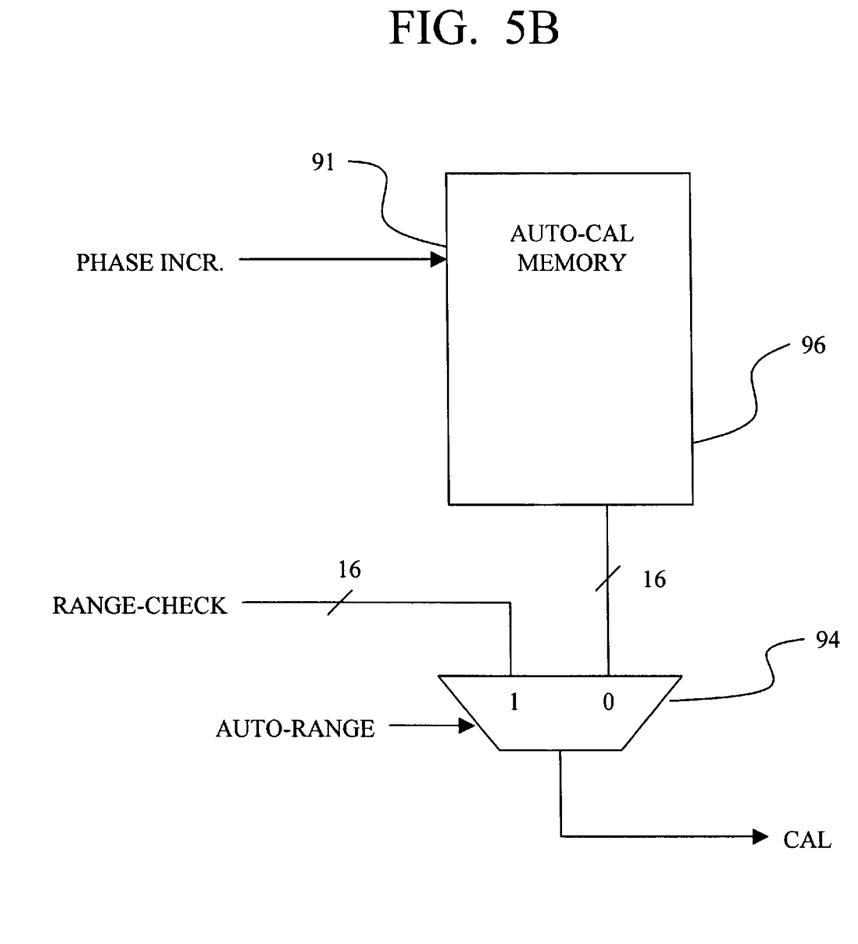
FIG. 5B is a block diagram of an optional automatic calibration circuit for use with the analog clock of FIG. 3.

A particularly useful optional feature of the present invention provides an automatic calibration adjustment module 92 for automatically adjusting the opcode offset constant and range check values. This is especially beneficial in situations where fine tuning of the relationship between the digital and analog edges is not required. Referring now to FIG. 5B, the auto-adjust module 92 includes a databus register 94 and an auto-cal memory 96 comprising a set of thirty-two sixteen-bit registers. The registers are addressed with a registered address and written by normal databus transactions. For readout, the registers are addressed by hashed bits of the phase increment value, at 91, which comprises a constant value added to the accumulator value to determine the DDS frequency of operation. When "auto-ranging" is not enabled, each of the four range check values and the offset constant may be written separately with a value that is derived from the exact frequency from an external table by interpolation.

When the databus register 94 is enabled, each of the range check and offset value constants will be obtained from a table which is written at map time from an NVRAM (previously calibrated values). Each of the range check values comprises an offset which is one of the quarter-wave values of the accumulator plus the offset constant. An exemplary table is illustrated below:

| AMC FREQUENCY (approx) | DDS OUTPUT FREQUENCY (approx) | DDS PERIOD ADDER | LOOKUP OFFSET BITS 28:24 |
|---|---|---|---|
| 62.50 MHz | 15.63 MHz | 0x2800 000 | bin 0 1 0 0 0 |
| 64.06 MHz | 16.02 MHz | 0x2900 000 | bin 0 1 0 0 1 |
| 65.62 MHz | 16.40 MHz | 0x2a00 000 | bin 0 1 0 1 0 |
| 73.48 MHz | 18.36 MHz | 0x2f00 000 | bin 0 1 1 1 1 |
| 75.00 MHz | 18.75 MHz | 0x3000 000 | bin 1 0 0 0 0 |
| 76.56 MHz | 19.14 MHz | 0x3100 000 | bin 1 0 0 0 1 |
| 96.88 MHz | 24.22 MHz | 0x3e00 000 | bin 1 1 1 1 0 |
| 98.52 MHz | 24.63 MHz | 0x3f00 000 | bin 1 1 1 1 1 |
| 100 MHz | 25.00 MHz | 0x4000 000 | bin 0 0 0 0 0 |

As described above, the prediction logic 72 provides a way of detecting when an analog clock edge falls within a particular 100 MHz clock period. The output of the prediction logic comprises one input to an opcode state logic module 98 (FIG. 6) that synchronizes the passing of opcode from the digital to analog domain.

Figure 6:
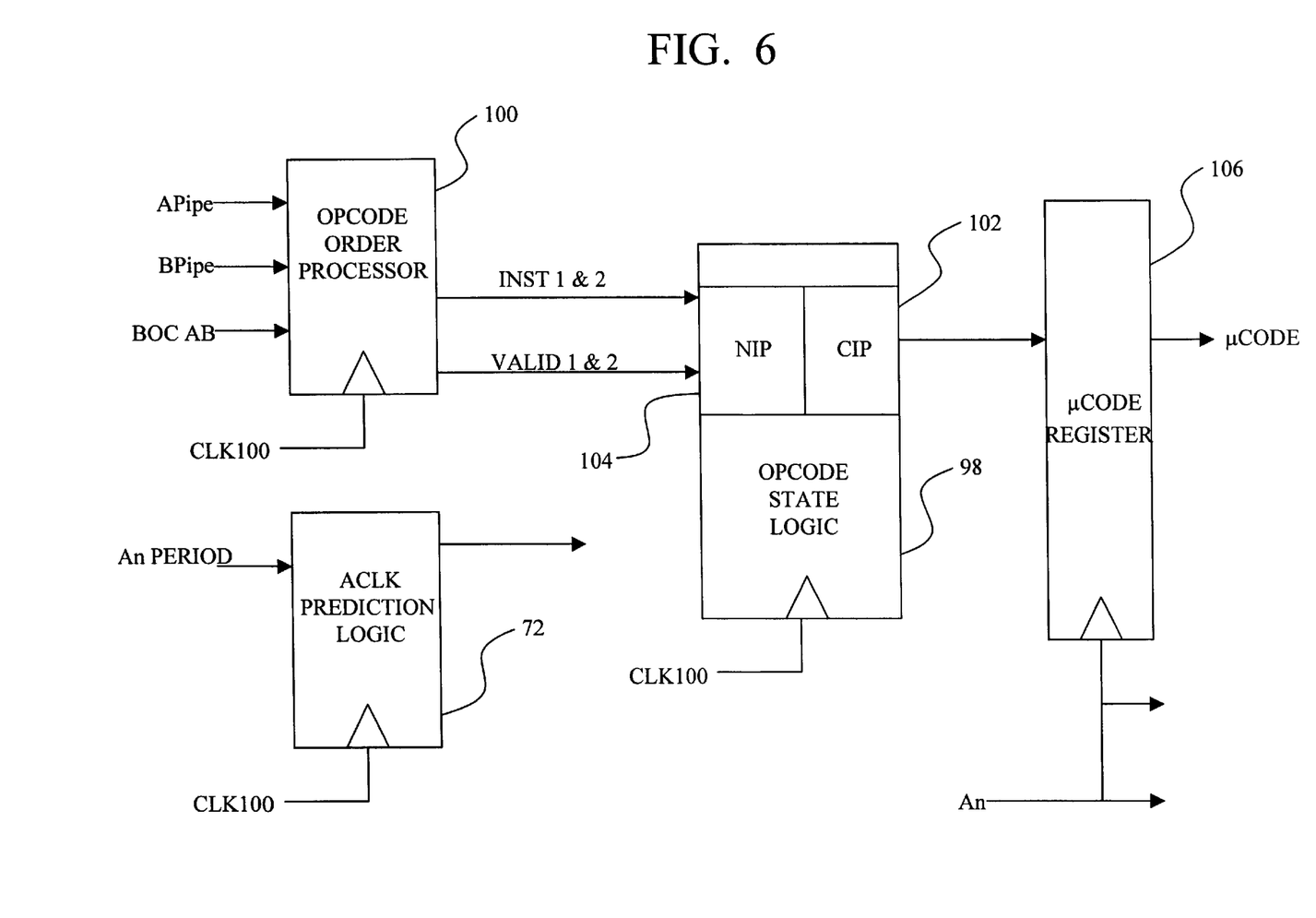
FIG. 6 is a block diagram of the opcode logic and processing that utilizes the output of the analog clock module of FIG. 3.

Referring now to FIG. 6, the opcode state logic 98 receives additional input signals from an opcode order processing module 100 that organizes ordered pairs of six-bit instruction signals INST1 & 2 and VALID1 & 2 in response to a plurality of input signals Apipe, Bpipe and BOC AB. The instruction signals and the ACLK event signals are fed to the opcode state logic which maintains respective current-instruction-pending (CIP) registers 102 and next-instruction-pending (NIP) registers 104. The output of the opcode state logic couples to a lookup table (not shown), which expands the four-bit CIP into a six-bit CIP. A microcode register 106 outputs the expanded microcode signal to the analog instrument cards 30 (FIG. 2). The state machine controlling this opcode passing logic uses the digital ACLK prediction to guarantee that each opcode is presented, so that vector blocks can be abutted and the frequency moved around while predictable operation is maintained. Overflow errors are reported if too many digital instructions are presented due to clock rate differences.

Much of the hardware described above conveniently lends itself to modularized implementations. For example, many of the components that comprise the analog clock module, such as the DSS 52, the prediction logic 72, the calibration registers and clock dividers, may be formed on a single application-specific-integrated-circuit (ASIC). Not only does this allow for relatively inexpensive component costs, but many of the elements of skew between the analog and digital logic may be eliminated or included in the calibration process. Moreover, logic gate delays are matched to track drifts in delay between clock circuits.

In operation, the analog clock module of the present invention utilizes the prediction logic, the calibration logic, and the opcode passing circuitry to carry out a plurality of prediction, calibration, and synchronization methods, as described below.

Figure 7:
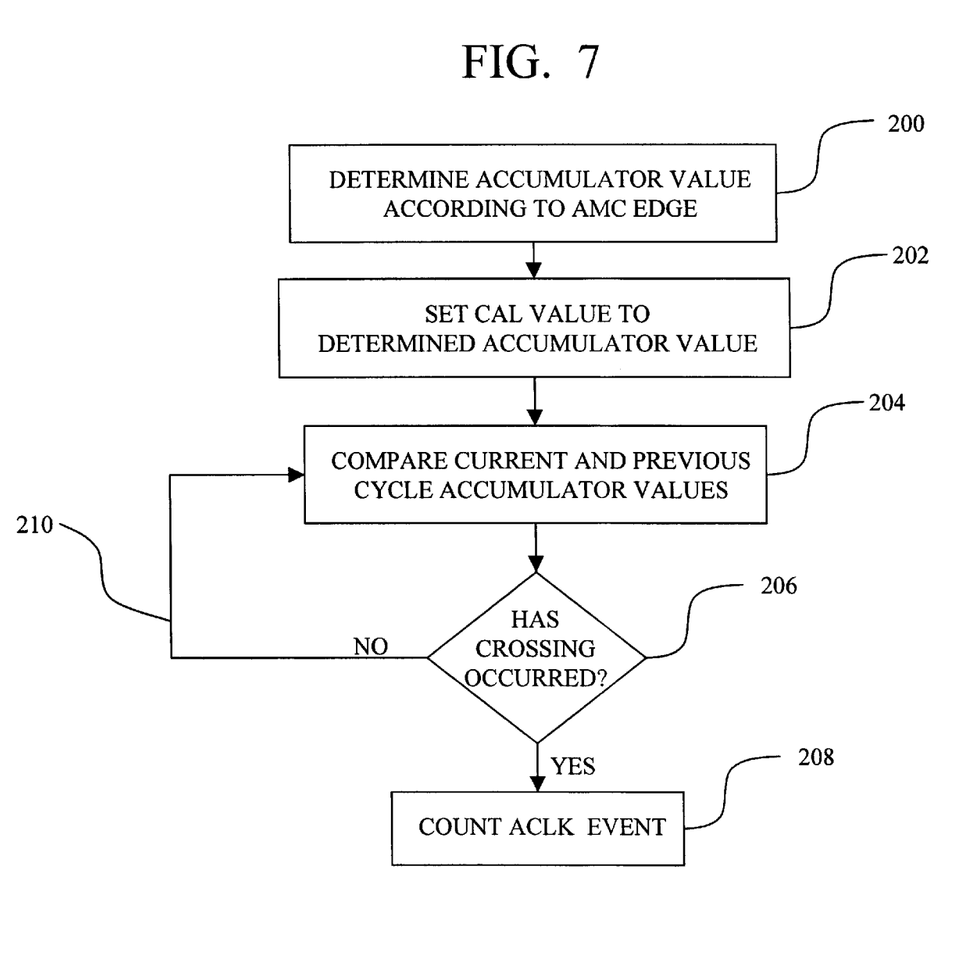
FIG. 7 is a functional diagram illustrating steps employed in the prediction method of the present invention.

Referring now to FIG. 7, during operation of the analog clock module, the prediction logic 72 first determines the accumulator value that corresponds to the rising edge of the AMC clock, at step 200. The CAL value is then set, at step 202, to the accumulator value that corresponds to the AMC rising (active) edge. Then, at step 204, the current and previous accumulator values are compared by the edge detection logic to see if a crossing has occurred, at step 206. If a crossing is detected, an ACLK DETECT signal is generated, at step 208, which is counted by the ACLK prediction divider 84. Otherwise, the method returns to the comparison step 204, at 210. Assuming that the divider started "in sync" with the analog divider 90, the countdown of the prediction divider 84 corresponds to a 100 MHZ cycle in which an analog clock is occurring.

Figure 8:
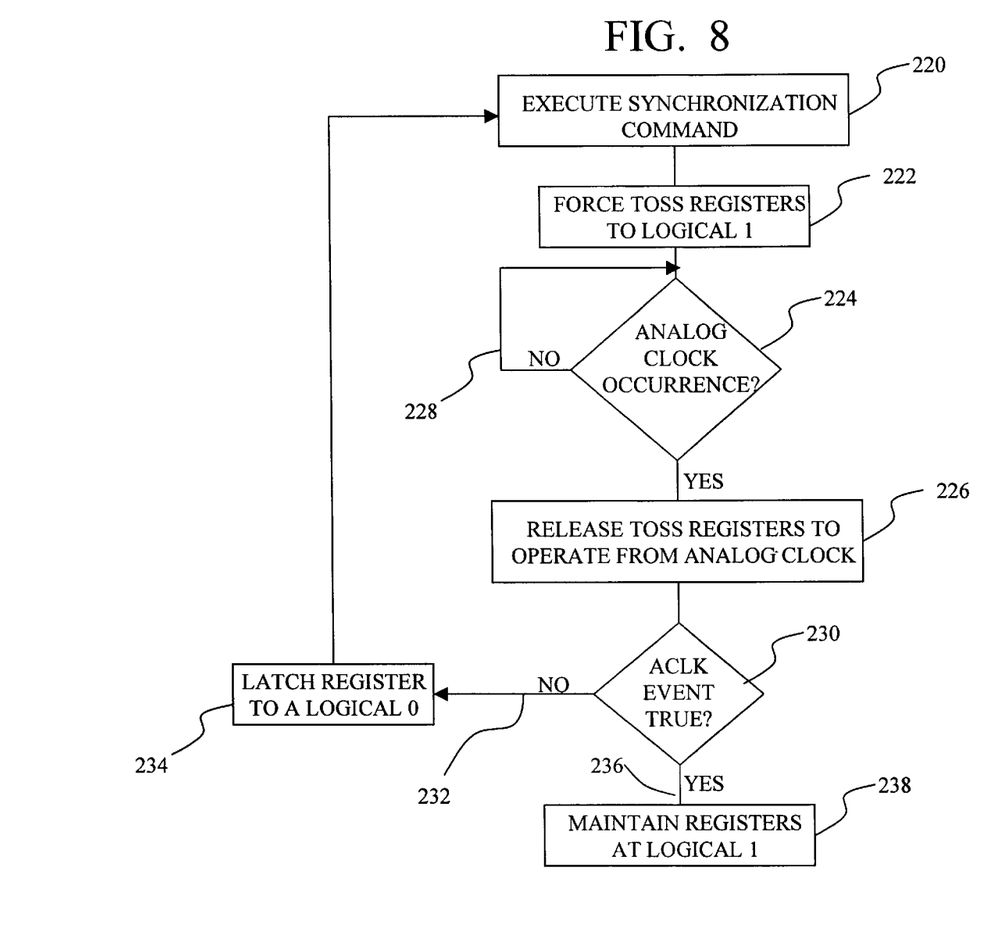
FIG. 8 is a functional diagram illustrating steps employed in the calibration method of the present invention.

With reference to FIG. 8, the ACLK event signal plays an important role in the calibration method carried out by the calibration hardware 80 and 92. The calibration technique first executes a synchronization command, at step 220. Then, the toss registers are forced to a logical one, at step 222. When an analog clock occurrence is detected, at step 224, the toss registers are released from the logical 1 state to operate from the analog clock, at step 226. If no clock is detected, the registers remain in the logical 1 state, at step 228, and wait for the clock occurrence. The input to the toss registers is an AND result of the current value and the ACLK predict signal. The ACLK event signal is then analyzed, at step 230, for a "true" or "not true" determination. When the register is clocked by the analog clock and ACLK predict is not true, at 232, the registers latch to a zero, at step 234. If the ACLK predict is in sync (ACLK true), at step 236, the registers are maintained at a logical one at step 238. The above steps are repeated over a range of calibration values, and for the range of frequencies represented by the entries in the auto-cal memory tables. This generates a map of the regions for which the circuit is CALIBRATED at each frequency.

The operation of the hardware also allows for the convenient independent adjustment of a variety of parameters associated with the analog clock module. For instance, to align the DDS, a command is issued that controls the accumulator period adder inputs in a synchronous fashion. For one cycle, a new value is multiplexed which comprises the algebraic addition of the 1) digital residue of the command; and 2) an edge cal constant. When the values are added together, a "one-time" period adder is formulated that has the effect of syncing it to the digital residue, and adding in a calibration constant (the difference between the analog and digital edges).

However, the alignment of the digital and analog edges following the alignment command resets the expected offset of the AMC. This introduces a phase-shift into the analog frequency, and changes the number of clock counts available for production of an output analog clock by the clock divide circuitry. In order to bring the clock prediction circuitry for opcode tossing back to the correct state, the alignment command must be followed by a resynchronization command for the clock divider to synchronize with the clock prediction logic 72.

Because the resynchronization command is an instruction issued from the digital domain, it must be synchronized into the analog clock domain to avoid "runt" clock pulses and minimize the perturbation of the PLL 68. At the same time, it is highly desirable for the circuitry to avoid waiting for a potentially large divider value to roll back around to the final count.

Figure 9:
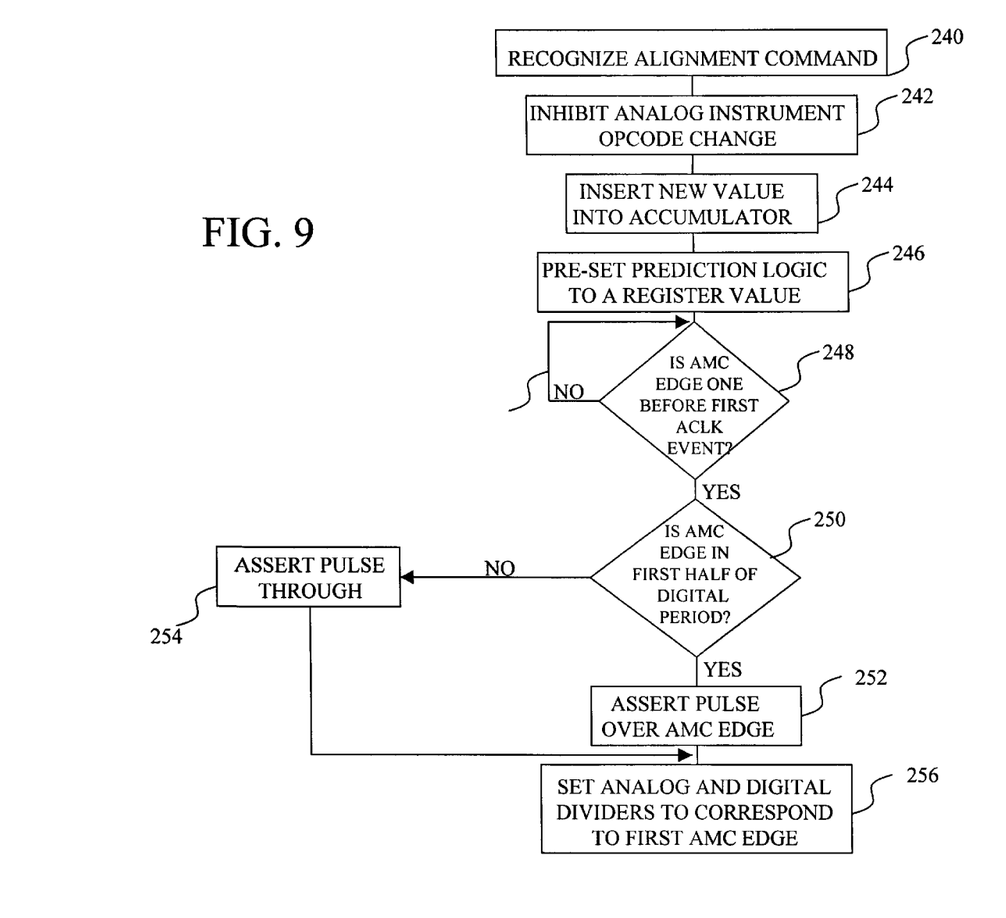
FIG. 9 is a functional diagram illustrating steps employed in the edge alignment and synchronization method of the present invention.

Referring now to FIG. 9, to automatically resynchronize the analog clock output to the clock prediction logic, the synchronization hardware generally adds half of the normal phase increment value to the current accumulator value. It uses the CAL value to determine if the previous and current accumulator values will produce an AMC clock edge in the first half of the reference clock period. Thus, it can recognize which half of the next 100 Mhz clock an AMC clock will occur.

The synchronization method begins with the opcode passing circuitry recognizing an alignment command in the digital data stream, at step 240, and inhibiting the analog instrument opcode from changing, at step 242. A new value is inserted into the accumulator 56, at step 244, followed by, at step 246, presetting the prediction logic 72 to a register value. A delay is carried out, at step 248, until the AMC edge is one before the first ACLK event. If there is an AMC edge in the first half of the digital reference clock period, a 5 ns pulse is asserted over the AMC edge, at step 252. If there is no AMC edge in the first half of the reference clock period, the pulse is passed through at step 254. The delivered pulse sets the analog divider and digital dividers to correspond to the first "legal AMC edge"(that is not supressed) at step 256. This acts to issue an analog clock edge (analog divider) and ACLK PREDICT (digital divider) while the dividers in both time domains start in a timed relationship from the digital domain. At this point, the analog divider and the prediction logic are synchronized, enabling opcode propagation to proceed.

Those skilled in the art will appreciate the many benefits and advantages afforded by the present invention. Of particular importance is the straightforward prediction logic and processing associated with the analog clock module. By implementing a "same frequency" clock to carry out the analog/digital coincident edge prediction, significant cost savings are realized from the minimal hardware and calibration steps necessary to maintain the hardware operating accurately.

Another important feature involves the capability of predicting the coincidence of an analog clock edge with the rising-edge of a particular digital master clock period. By implementing a defined "window" from which to determine the edge coincidence, opcode tossing from the digital to analog domain may occur in a deterministic and repetitive manner.

While the invention has been particularly shown and described with reference to the preferred embodiments thereof, it will be understood by those skilled in the art that various changes in form and detail may be made therein without departing from the spirit and scope of the invention.

What is claimed is:

1. An analog clock apparatus including:
   a digital clock source for producing a digital waveform of a predetermined frequency;

a direct-digital-synthesizer having an input to receive said digital waveform and operative to generate a resultant analog waveform, said direct-digital synthesizer including a prediction clock to generate a prediction clock waveform having a clock frequency based on said analog waveform and approximating that of said digital clock source; and prediction logic coupled to said digital clock source and said prediction clock for determining the relative phase relationships between said digital waveform and said analog waveform.

2. An analog clock apparatus according to claim 1 wherein said direct-digital-synthesizer includes:

a counter for receiving said digital waveform and establishing a numerical value, said counter operative to incrementally increase said numerical value in response to continued input of said digital waveform;

a converter disposed at the output of said counter for transforming said incremental numerical value into a sinusoidal waveform; and a signal conditioner coupled to said converter.

3. An analog clock apparatus according to claim 2 wherein said counter comprises an accumulator.

4. An analog clock apparatus according to claim 2 wherein said converter comprises:

a sinusoid look-up table;

and a digital-to-analog converter for generating said sinusoidal waveform from said sinusoid look-up table.

5. An analog clock apparatus according to claim 2 wherein said signal conditioner includes:

a filter disposed at the output of said converter for generating a filtered signal;

a clipping amplifier having an input for receiving said filtered signal and operative to increase the edge rate of said filtered signal;

a frequency multiplier coupled to the output of said clipping amplifier for multiplying said filtered signal a predetermined integer multiple; and a divider connected to the output of said multiplier for reducing said multiplied frequency to a desired frequency.

6. An analog clock apparatus according to claim 5 wherein:

said filter comprises a bandpass filter.

7. An analog clock apparatus according to claim 5 wherein:

said frequency multiplier comprises a phase-locked-loop multiplier.

8. An analog clock apparatus according to claim 1 wherein:

said prediction clock comprises a phase-locked-loop multiplier to generate a prediction clock waveform disposed at the output of said digital synthesizer; and said prediction logic includes edge-detection circuitry.

9. An analog clock apparatus according to claim 1 and further including:

calibration logic coupled to said digital clock source.

10. An analog clock apparatus according to claim 9 wherein said calibration logic includes:

a waveform aligner.

11. An analog clock apparatus according to claim 1 and further including:

opcode passing circuitry coupled to said prediction logic.

12. An analog clock apparatus according to claim 11 wherein said opcode passing circuitry includes:

an opcode order processing module for organizing ordered pairs of instruction signals;

opcode state logic coupled to said order processing module, said opcode state logic including a plurality of registers for storing current-instruction signals and next-instruction signals, said opcode state logic responsive to said prediction logic to present opcode signals for execution.

13. An analog clock apparatus including:

a digital clock source for producing a digital waveform of a predetermined frequency;

a direct-digital-synthesizer having an input to receive said digital waveform and operative to generate a resultant analog waveform; and opcode passing circuitry disposed at the output of said synthesizer; and prediction logic coupled to said digital clock source and said synthesizer for determining the relative phase relationships between said digital waveform and said resultant analog waveform.

14. An analog clock apparatus according to claim 13 wherein said opcode passing circuitry includes:

an opcode order processing module for organizing ordered pairs of instruction signals;

opcode state logic coupled to said opcode order processing module, said opcode state logic including a plurality of registers for storing current-instruction signals and next-instruction signals, said opcode state logic responsive to said prediction logic to present said opcode signals for execution.

* * * * *